United States Patent
Lai et al.

(10) Patent No.: US 10,514,603 B2
(45) Date of Patent: *Dec. 24, 2019

(54) PHOTORESIST AND METHOD

(71) Applicant: Taiwan Semiconductor Manufacturing Company, Ltd., Hsinchu (TW)

(72) Inventors: Wei-Han Lai, New Taipei (TW); Ching-Yu Chang, Taipei (TW); Chen-Hau Wu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/525,120

(22) Filed: Jul. 29, 2019

(65) Prior Publication Data

US 2019/0346766 A1 Nov. 14, 2019

Related U.S. Application Data

(60) Continuation of application No. 16/154,292, filed on Oct. 8, 2018, now Pat. No. 10,365,561, which is a division of application No. 14/334,612, filed on Jul. 17, 2014, now Pat. No. 10,095,113.

(60) Provisional application No. 61/912,967, filed on Dec. 6, 2013.

(51) Int. Cl.
*G03F 7/039* (2006.01)
*G03F 7/20* (2006.01)
*G03F 7/32* (2006.01)

(52) U.S. Cl.
CPC .......... *G03F 7/0397* (2013.01); *G03F 7/2041* (2013.01); *G03F 7/322* (2013.01); *G03F 7/325* (2013.01)

(58) Field of Classification Search
None
See application file for complete search history.

(56) References Cited

U.S. PATENT DOCUMENTS

| | | |
|---|---|---|
| 4,072,527 A | 2/1978 | Fan |
| 4,212,935 A | 7/1980 | Canavello et al. |
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 5,902,599 A | 5/1999 | Anseth et al. |
| 6,008,265 A | 12/1999 | Vallee et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,548,226 B2 | 4/2003 | Lin |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,964,840 B2 | 11/2005 | Nishimura et al. |
| 6,991,888 B2 | 1/2006 | Padmanaban et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,300,747 B2 | 11/2007 | Okazaki et al. |
| 7,312,014 B2 | 12/2007 | Maesawa et al. |

(Continued)

FOREIGN PATENT DOCUMENTS

| | | |
|---|---|---|
| EP | 1500977 A1 | 1/2005 |
| JP | 2006145788 A | 6/2006 |
| JP | 2006178172 A | 7/2006 |
| JP | 2006317794 A | 11/2006 |
| JP | 2010164958 A | 7/2010 |
| JP | 2014115632 A | 6/2014 |
| KR | 100814488 B1 | 3/2008 |
| KR | 20120078672 A | 7/2012 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

(Continued)

*Primary Examiner* — Sin J Lee

(74) *Attorney, Agent, or Firm* — Slater Matsil, LLP

(57) ABSTRACT

Shrinkage and mass losses are reduced in photoresist exposure and post exposure baking by utilizing a small group which will decompose. Alternatively a bulky group which will not decompose or a combination of the small group which will decompose along with the bulky group which will not decompose can be utilized. Additionally, polar functional groups may be utilized in order to reduce the diffusion of reactants through the photoresist.

20 Claims, 5 Drawing Sheets

(56) References Cited

U.S. PATENT DOCUMENTS

| | | | |
|---|---|---|---|
| 7,320,855 B2 | 1/2008 | Huang et al. |
| 7,344,970 B2 | 3/2008 | Forman et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,919,222 B2 | 4/2011 | Vohra et al. |
| 7,927,779 B2 | 4/2011 | Chang |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,105,748 B2 | 1/2012 | Ohashi et al. |
| 8,216,767 B2 | 7/2012 | Wang et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,518,628 B2 | 8/2013 | Chang et al. |
| 8,586,290 B2 | 11/2013 | Wang et al. |
| 8,741,551 B2 | 6/2014 | Wu et al. |
| 8,932,799 B2 | 1/2015 | Wu et al. |
| 9,581,908 B2 | 2/2017 | Wu et al. |
| 10,095,113 B2 * | 10/2018 | Lai et al. ............. G03F 7/0397 430/270.1 |
| 10,365,561 B2 * | 7/2019 | Lai et al. ............. G03F 7/0397 430/270.1 |
| 2001/0044070 A1 | 11/2001 | Uetani et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0155383 A1 | 10/2002 | Fujimori et al. |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2003/0215748 A1 | 11/2003 | Thackeray et al. |
| 2003/0224287 A1 | 12/2003 | Fujimori |
| 2003/0235781 A1 | 12/2003 | Shida et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0020289 A1 | 1/2008 | Hatakeyama et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0241778 A1 | 10/2008 | Kulp |
| 2008/0248331 A1 | 10/2008 | Gallagher et al. |
| 2008/0261150 A1 | 10/2008 | Tsubaki et al. |
| 2009/0042147 A1 | 2/2009 | Tsubaki |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0047710 A1 | 2/2010 | Yamagishi et al. |
| 2010/0068650 A1 | 3/2010 | Nishimura et al. |
| 2010/0086870 A1 | 4/2010 | Ogihara et al. |
| 2010/0099042 A1 | 4/2010 | Ohashi et al. |
| 2010/0239984 A1 | 9/2010 | Tsubaki |
| 2010/0304295 A1 | 12/2010 | Kinsho et al. |
| 2010/0304302 A1 | 12/2010 | Masunaga et al. |
| 2011/0020755 A1 | 1/2011 | Tsubaki |
| 2011/0097670 A1 | 4/2011 | Wang et al. |
| 2011/0236826 A1 * | 9/2011 | Hatakeyama ........... C07C 69/54 430/270.1 |
| 2011/0250543 A1 | 10/2011 | Tsubaki |
| 2011/0263136 A1 | 10/2011 | Kim et al. |
| 2012/0052687 A1 | 3/2012 | Raghavan et al. |
| 2012/0171616 A1 | 7/2012 | Thackeray et al. |
| 2012/0202158 A1 | 8/2012 | Hatakeyama et al. |
| 2012/0214101 A1 | 8/2012 | Shimizu et al. |
| 2012/0238106 A1 | 9/2012 | Chuang |
| 2012/0282553 A1 | 11/2012 | Kimura et al. |
| 2012/0288794 A1 | 11/2012 | Bae et al. |
| 2012/0308741 A1 | 12/2012 | Kim et al. |
| 2012/0308939 A1 | 12/2012 | Kudo et al. |
| 2013/0045365 A1 | 2/2013 | Kato et al. |
| 2013/0171560 A1 | 7/2013 | Shin et al. |
| 2013/0203000 A1 | 8/2013 | Matsuda et al. |
| 2013/0288180 A1 | 10/2013 | Hatakeyama et al. |
| 2014/0011133 A1 | 1/2014 | Liu et al. |
| 2014/0045117 A1 | 2/2014 | Yamaguchi et al. |
| 2014/0113236 A1 | 4/2014 | Senzaki et al. |
| 2014/0363772 A1 | 12/2014 | Tsuchiya et al. |
| 2015/0086924 A1 | 3/2015 | Wu et al. |
| 2015/0160552 A1 | 6/2015 | Lai et al. |

FOREIGN PATENT DOCUMENTS

| | | |
|---|---|---|
| KR | 101207444 B1 | 11/2012 |
| KR | 101207446 B1 | 12/2012 |
| TW | 536661 B | 6/2003 |
| TW | 200831546 A | 8/2008 |
| TW | 1336819 B | 2/2011 |
| TW | 1341961 B | 5/2011 |
| TW | 1343513 B | 6/2011 |
| WO | 2005088397 A2 | 9/2005 |
| WO | 2006054432 A1 | 5/2006 |
| WO | 2008140846 A1 | 11/2008 |
| WO | 2012036250 A1 | 3/2012 |
| WO | 2012133257 A1 | 10/2012 |
| WO | 2012169620 A1 | 12/2012 |
| WO | 2013039243 A1 | 3/2013 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., "Kunz SPIE Short Course," 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

(56) References Cited

OTHER PUBLICATIONS

Lin et al., "A Water-Castable, Water-Developable Chemically Amplified Negative-Tone Resist," 1997 Chem. Mater No. 9, vol. 8, pp. 1725-1730.
Reiser, Arnost, "Photoreactive Polymers: The Science and Technology of Resists," Feb. 1989, 409 pages, Wiley-Interscience, New York.
Robertson, Stewart et al., "Physical Resist Simulation for a Negative Tone Development Process," 2010 International Symposium on Lithography Extension, Oct. 20-22, 2010, 19 pages.
Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.
Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.
Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.
Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

\* cited by examiner

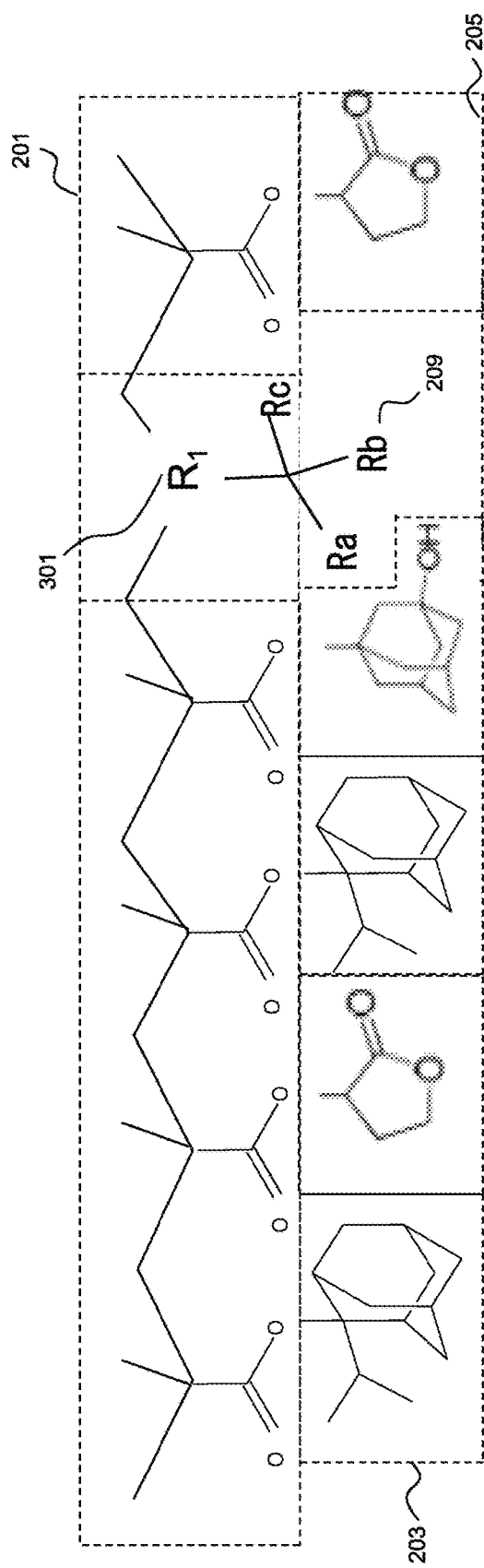
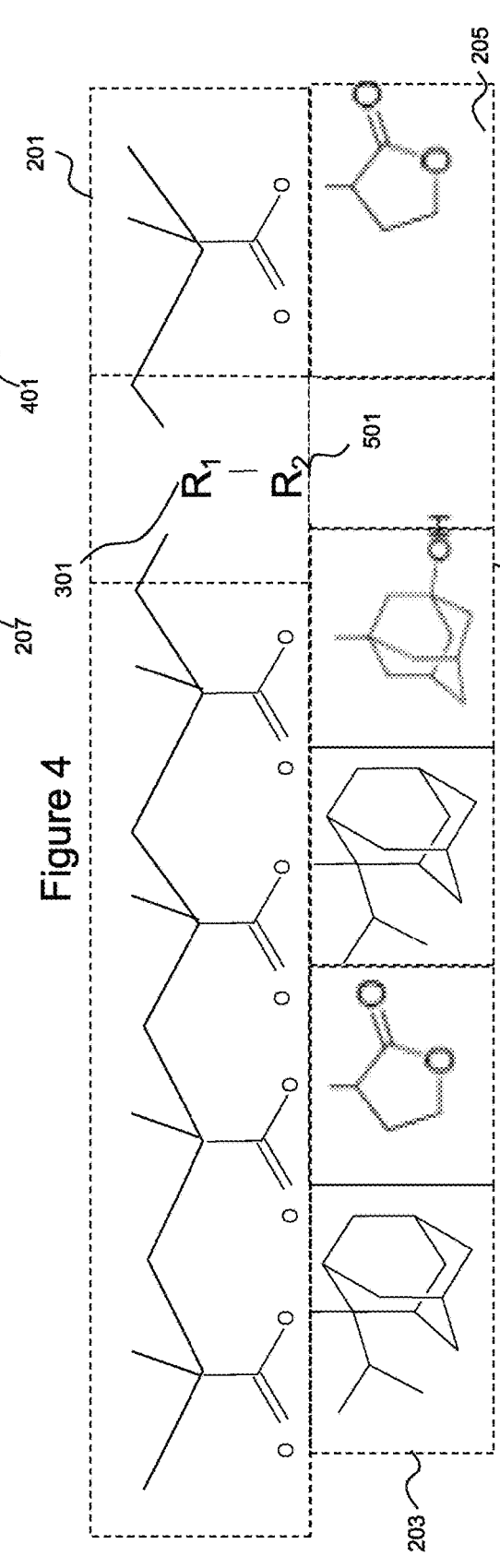
Figure 4
Figure 5

PHOTORESIST AND METHOD

PRIORITY CLAIM AND CROSS-REFERENCE

This application claims priority to and is a continuation of U.S. patent application Ser. No. 16/154,292, entitled "Photoresist and Method" and filed on Oct. 8, 2018, which claims priority to and is a divisional of U.S. patent application Ser. No. 14/334,612 entitled "Photoresist and Method" and filed on Jul. 17, 2014 (now U.S. Pat. No. 10,095,113, issued Oct. 9, 2018), which claims the benefit of U.S. Provisional Application No. 61/912,967, filed on Dec. 6, 2013, and entitled "Negative Tone Developer Photoresist and Device Manufactured Using Same," which applications are incorporated herein by reference.

Additionally, this application is related to U.S. Pat. No. 9,581,908 entitled "Photoresist and Method," filed on Jul. 17, 2014 and issued on Feb. 28, 2017, which application is hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing have become tighter and tighter. As such, advances in the field of photolithographic processing have been necessitated in order to keep up the ability to scale down the devices, and further improvements are needed in order to meet the desired design criteria such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a photoresist with a bulky group which will not decompose and a small group which will decompose in accordance with some embodiments;

FIG. 5 illustrates a photoresist with a polar functional group in accordance with some embodiments;

DETAILED DESCRIPTION

Figure 1:
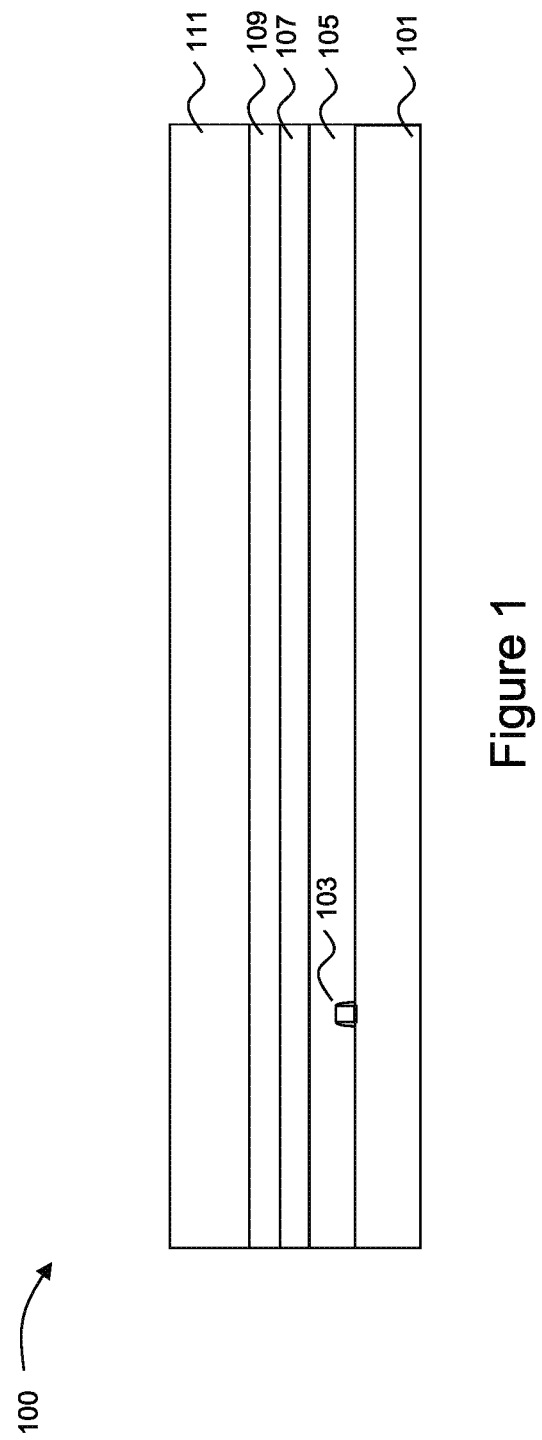
FIG. 1 illustrates a substrate with a layer to be patterned and a photoresist in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a semiconductor device 100 with a substrate 101, active devices 103 on the substrate 101, an interlayer dielectric (ILD) layer 105 over the active devices 103, metallization layers 107 over the ILD layer 105, a layer to be patterned 109 over the ILD layer 105, and a photoresist 111 over the layer to be patterned 109. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used for either layer. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as a single layer, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

A layer to be patterned 109 or otherwise processed using the photoresist 111 is formed over the metallization layers 107. The layer to be patterned 109 may be an upper layer of the metallization layers 107 or else may be a dielectric layer (such as a passivation layer) formed over the metallization layers 107. In an embodiment in which the layer to be patterned 109 is a metallization layer, the layer to be patterned 109 may be formed of a conductive material using processes similar to the processes used for the metallization layers (e.g., damascene, dual damascene, deposition, etc.). Alternatively, if the layer to be patterned 109 is a dielectric layer the layer to be patterned 109 may be formed of a dielectric material using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

The photoresist 111 is applied to the layer to be patterned 109. In an embodiment the photoresist 111 includes a polymer resin along with one or more photoactive compounds (PACs) in a solvent. The polymer resin and the PACs within the solvent are applied to the layer to be patterned 109 and a pre-exposure bake is performed in order to heat and drive off the solvent in order to remove the solvent and leave behind the polymer resin and the PACs for exposure.

Figure 2:
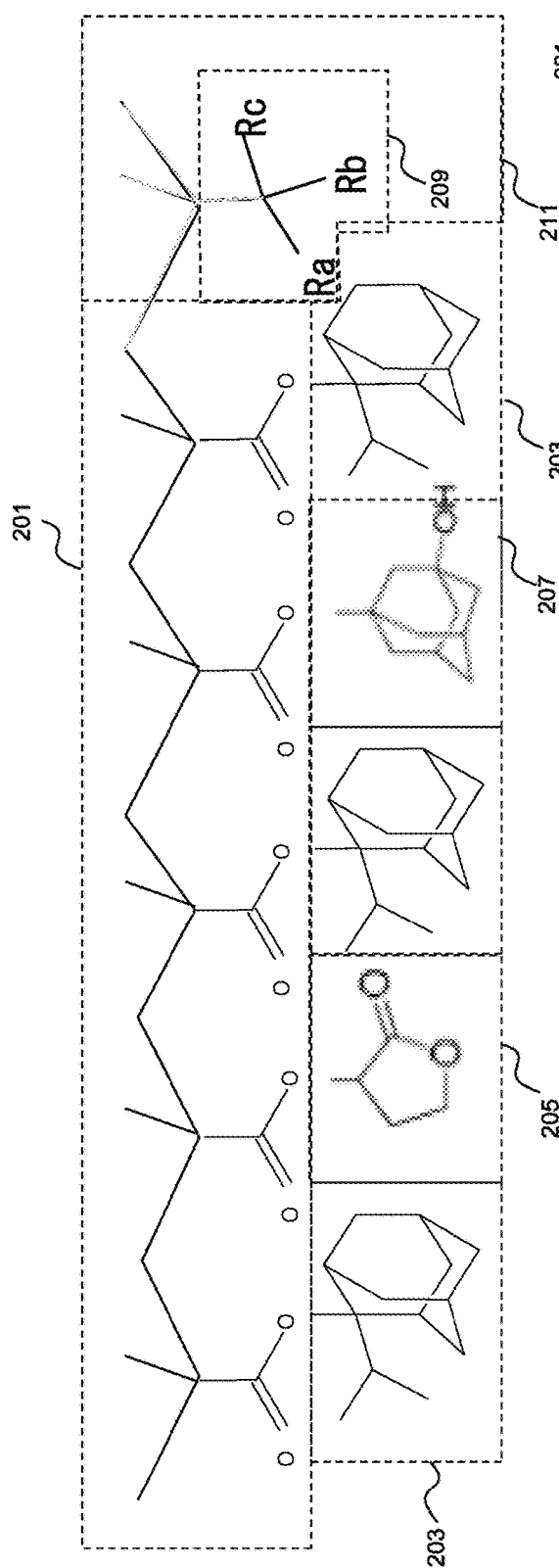
FIG. 2 illustrates a photoresist with a small group which will decompose in accordance with some embodiments.

FIG. 2 illustrates one embodiment of the polymer resin that may be used for the photoresist 111. In this embodiment the polymer resin may comprise a hydrocarbon structure (such as a alicyclic hydrocarbon structure, represented in FIG. 2 within the dashed box 201) that contains one or more bulky groups that will decompose (or cleavage, e.g., acid leaving groups, represented in FIG. 2 within the dashed box 203) or otherwise react when mixed with acids, bases, or free radicals generated by the PACs (as further described below). In an embodiment the hydrocarbon structure 201 comprises a repeating unit that forms a skeletal backbone of the polymer resin. This repeating unit may include acrylic esters, methacrylic esters, crotonic esters, vinyl esters, maleic diesters, fumaric diesters, itaconic diesters, (meth) acrylonitrile, (meth)acrylamides, styrenes, vinyl ethers, combinations of these, or the like.

Specific structures which may be utilized for the repeating unit of the hydrocarbon structure 201 include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy) ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure 201 may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include cycloalkane, adamantine, adamantine, norbornane, isobornane, tricyclodecane, tetracycododecane, or the like.

The bulky group which will decompose 203, otherwise known as a bulky leaving group or, in an embodiment in which the PAC is a photoacid generator, a bulky acid leaving group, is attached to the hydrocarbon structure 201 so that it will react with the acids/bases/free radicals generated by the PACs during exposure. In an embodiment the bulky group which will decompose 203 may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the bulky group which will decompose 203 has greater than nine carbon atoms and comprises greater than about 45% of the loading (the available sites on the hydrocarbon backbone which may receive functional groups such as the bulky group which will decompose 203). However, while the percentage of loading is provided as an illustrative example, the loading described herein is not intended to be limiting, as any suitable loading may alternatively be utilized.

Additionally, the polymer resin may also contain a small group which will decompose monomer (represented in FIG. 2 by the dashed box labeled 211) with a small group which will decompose (represented in FIG. 2 by the dashed box labeled 209). In such an embodiment the small group which will decompose monomer 211 may have the following structure:

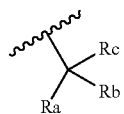

Wherein Ra, Rb, and Rc each independently represent a group selected from the group consisting of a C1~C5 alkyl group, a cycloalkyl group, a hydroxylalkyl group, an alkoxy group, an alkoxyl alkyl group, an actcetyl group, an acetylalkyl group, a carboxyl group, an alkyl carboxyl group, a cycloalky group, and a heterocycloalkyl group, or adjacent group may be bonded to each other to form a C3~C9 saturated or unsaturated hydrocarbon ring or a C3-C9 heterocyclic group. The structure can be long a chain, cyclic, or a 3D structure. In particular embodiments, the small group which will decompose may have less than nine carbon atoms.

Specific structures that may be utilized for the small group which will decompose monomer 211 with the small group which will decompose 209 include the following:

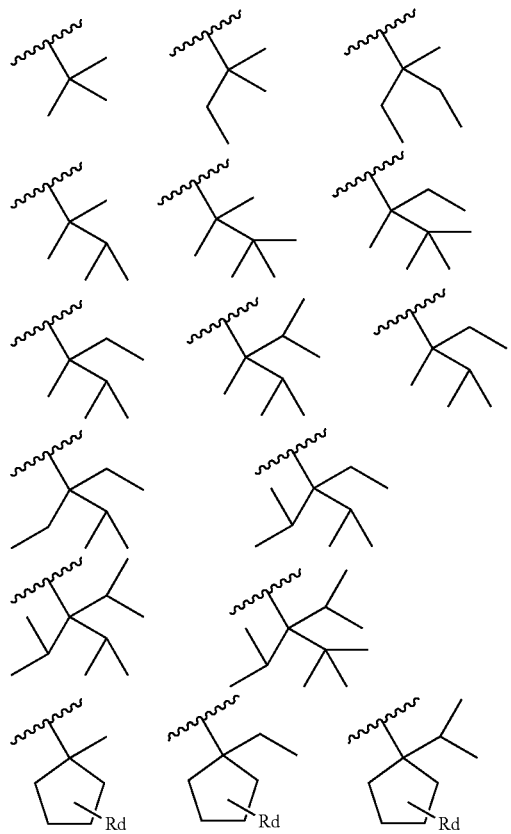

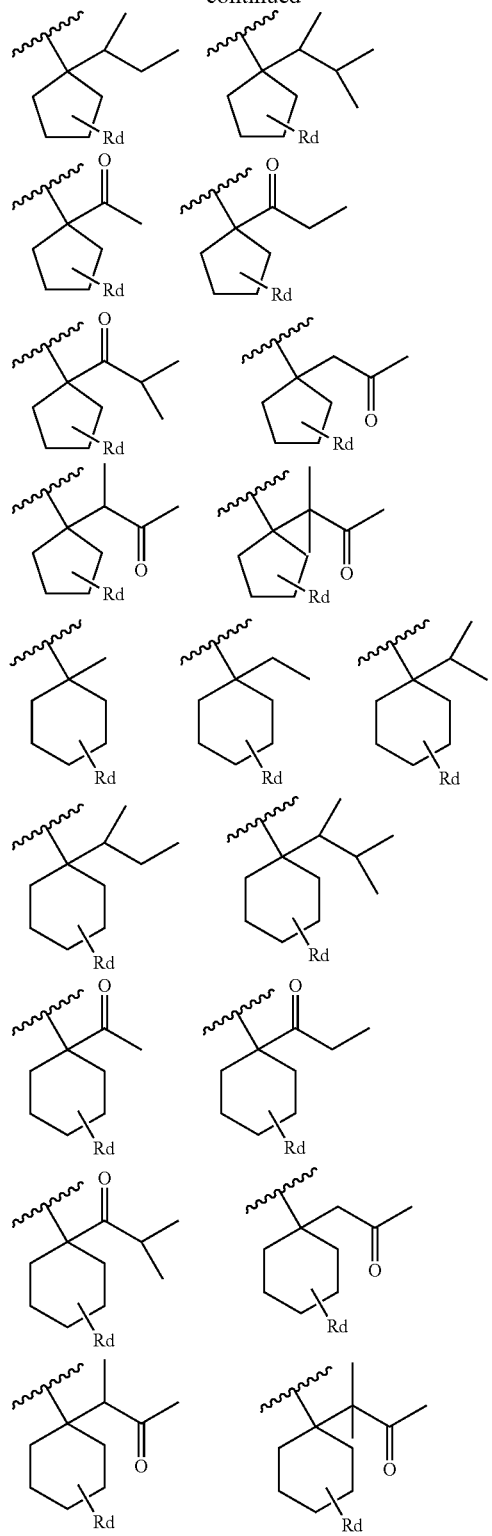

Wherein Rd is a C0-C3 alkyl group.

In an embodiment the small group which will decompose monomer 211 may comprise greater than 5% of the monomers within the polymer resin. However, such a number is intended to only be illustrative and is not intended to be limiting to the current embodiments. Rather, any suitable amount of the small group which will decompose monomer 211 may be utilized in an effort to reduce the shrinkage of the photoresist 111.

By utilizing the small group which will decompose monomer 211, the small group which will decompose monomer 211 will react with the PACs and form a leaving group, such as an acid leaving group, which will degas along with the leaving group from the bulky group which will decompose 203, thereby changing the solubility of the polymer resin in the region of exposure. However, because the small group which will decompose monomer 211 has the small group which will decompose 209 which has a fewer number of atoms on it than the bulky group which will decompose 203, the amount of mass that leaves the photoresist 111 is reduced, thereby minimizing any shrinkage and deterioration of critical dimensions that result from the degassing.

In an embodiment the polymer resin may optionally also comprise other groups attached to the hydrocarbon structure 201 that help to improve a variety of properties of the polymerizable resin. For example, inclusion of a lactone group (represented in FIG. 2 within dashed box 205) to the hydrocarbon structure 201 assists to reduce the amount of line edge roughness after the photoresist 111 has been developed, thereby helping to reduce the number of defects that occur during development. In an embodiment the lactone groups 205 may include rings having five to seven members, although any suitable lactone structure may alternatively be used for the lactone group 205, and the lactone group 205 may have a loading on the hydrocarbon backbone of between about 30% and about 70%.

In particular embodiments the lactone group 205 may comprise the following structures:

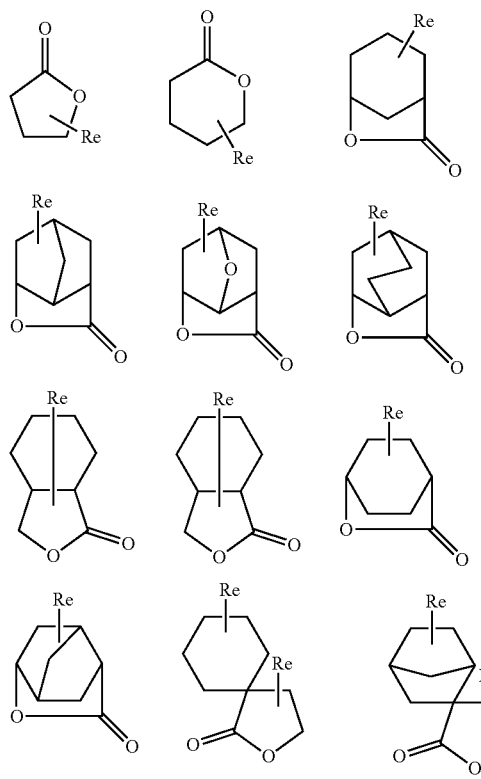

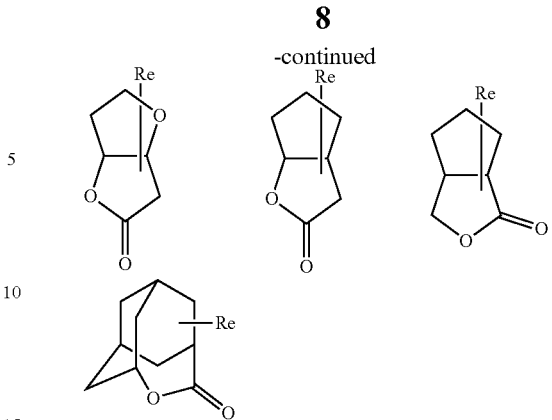

Wherein Re may represent C1-C8 alkyl group, a C4-C7 cycloalkyl group, a C1-C8 alkoxy group, a C2-C8 alkoxycarbonyl group, a carboyxl group, a halogen atom, a hydroxyl group, a cyano group, or a group which will decompose. Further, the lactone group may not have the Re group, or may have multiple Re groups bound together, wherein each of the Re groups may be the same or different from each other, in either a linear or cyclic structure.

The polymer resin may also optionally comprise groups that can assist in increasing the adhesiveness of the photoresist 111 (represented in FIG. 2 within the dashed box labeled 207) to underlying structures (e.g., the layer to be patterned 109). In an embodiment polar groups may be used to help increase the adhesiveness, and polar groups that may be used in this embodiment include hydroxyl groups, cyano groups, or the like, although any suitable polar group may alternatively be utilized. In an embodiment the group which assists in increasing the adhesiveness 207 may have a loading on the hydrocarbon backbone of less than about 20%.

The various groups desired within the polymer resin are then combined to form the polymer resin. In a particular embodiment, the various groups, such as the monomers with the small group which will decompose monomer 211, a monomer with the bulky group which will decompose 203, the adhesive group 207, the lactone group 205, and any other desired monomers will be polymerized with one another using, e.g., a radical polymerization, to form a polymer structure with the carbon chain backbone for the polymer resin.

Figure 3:
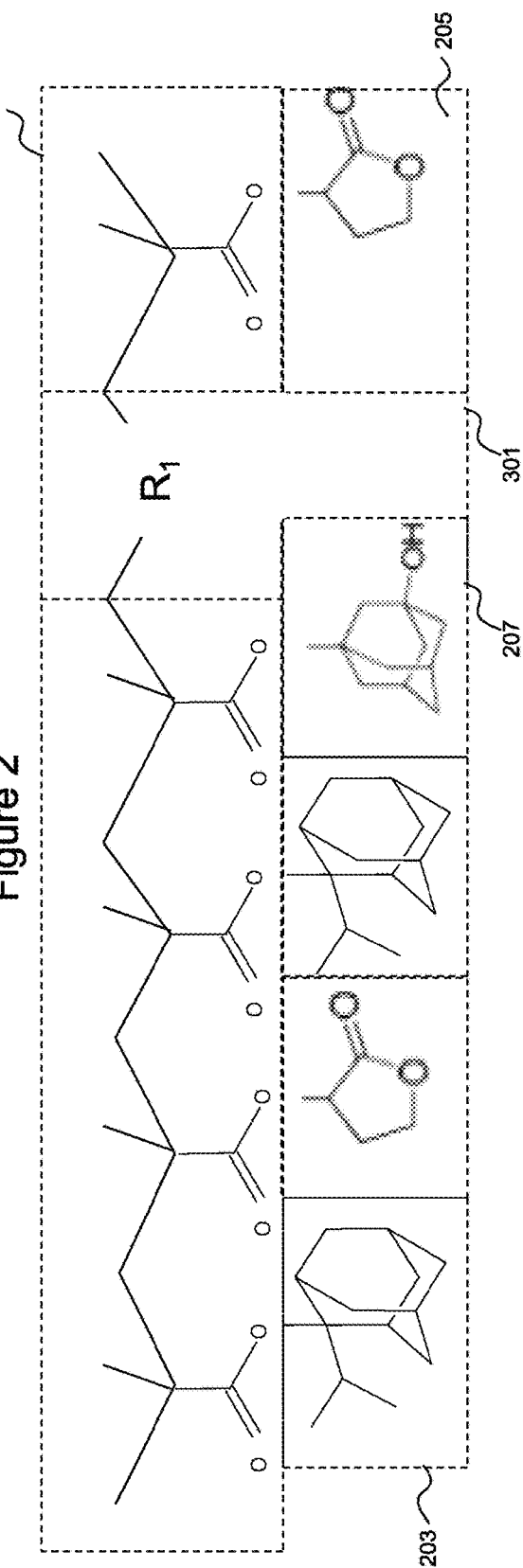
FIG. 3 illustrates a photoresist with a bulky group which will not decompose in accordance with some embodiments.

FIG. 3 illustrates another embodiment in which, instead of adding a small group which will decompose monomer 211 (not illustrated in FIG. 3 but illustrated and described above with respect to FIG. 2), a bulky group which will not decompose (represented in FIG. 3 by $R_1$ and the dashed box 301) is added to the polymer resin. In this embodiment the bulky group which will not decompose 301 may be an alkyl chain, an alkyl ring, or a three-dimensional alkyl structure with between nine and thirty carbon atoms, such as between eleven and thirty carbon atoms, or even between fourteen and thirty carbon atoms. In particular embodiments, suitable structures for the bulky group which will not decompose 301 include:

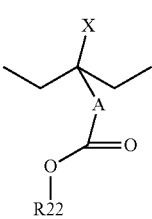

Wherein A represents a group selected from the group consisting of a C0~C8 alkanediyl group, a C1-C8 heteroalkanediyl group, a C2-C9 heteroalkenediyl group, a C3-C9 cycloalkenediyl group, a C2-C20 heterocycloalkanediyl group, or a C3-C9 heterocycloalkeneduyl group; R22 is a bulky unit with C2-C30 alkyl group, cycloalkyl group, hydroxylalkyl group, alkoxy group, alkoxyl alkyl group, acetyl group, acetylalkyl group, carboxyl group, alky caboxyl group, cycloalkyl carboxyl group, C2~C30 saturated or unsaturated hydrocarbon ring, or C2-C30 heterocyclic group which can be a chain, a ring, a 3-D structure (adamantyl for example), a cyclic to polymer backbone structure; and X is hydrogen, a methyl group, or R22.

In an embodiment in which the bulky group which will not decompose 301 has a cyclic structure bonded to the polymer backbone, the bulky group which will not decompose 301 may have the following structure:

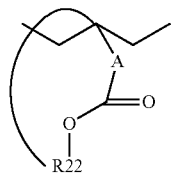

Wherein A and R22 are as described above.

In specific embodiments in which A is C0, the bulky group which will not decompose 301 may comprise the following structures:

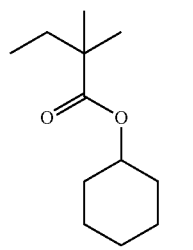 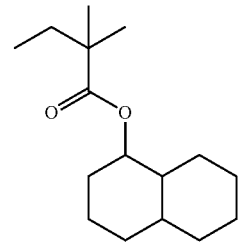

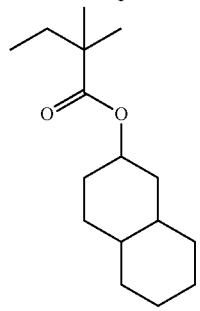 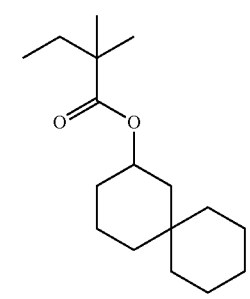

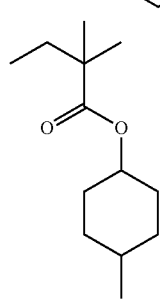 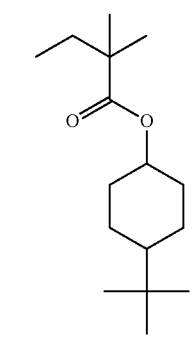

-continued

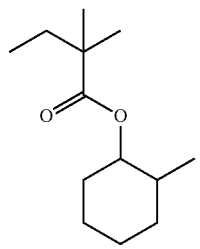 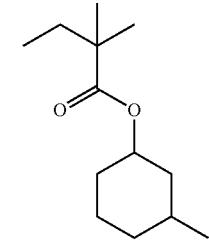

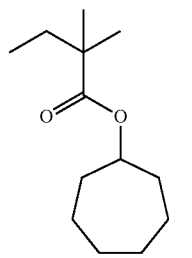 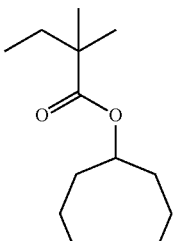

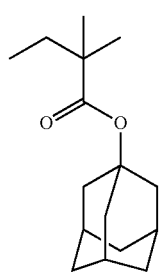 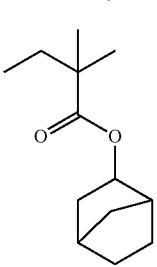

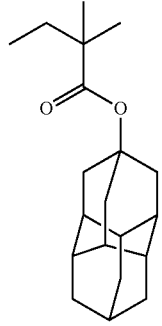 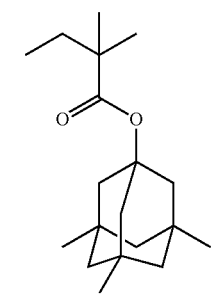

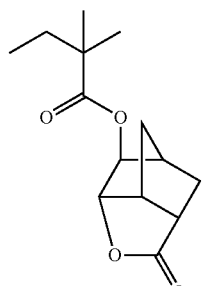 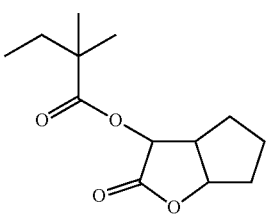

In an embodiment the bulky group which will not decompose 301 may have a loading on the hydrocarbon backbone of greater than about 5%. However, this loading is only intended to be illustrative and is not intended to be limiting upon the present embodiments. Rather, any suitable loading that will assist in the reduction of shrinkage and critical dimension loss may alternatively be utilized, and all such loadings are fully intended to be included within the scope of the embodiments.

By adding the bulky group which will not decompose 301 to the hydrocarbon backbone, additional mass that will not be cleaved from the hydrocarbon backbone may be added in order to compensate for the mass of the bulky group which will decompose 203 that will be lost. By compensating for the mass that will be lost, overall shrinkage and loss of critical dimension may be reduced and mitigated. As such, smaller and smaller dimensions may be imaged.

FIG. 4 illustrates yet another embodiment of a photoresist that may be used. In this embodiment the bulky group which will not decompose 301 (again represented in FIG. 4 by the designation $R_1$) is placed within the polymer resin, and a cleavage unit is bonded to the bulky group which will not decompose 301 (as illustrated within FIG. 4 by the dashed box labeled 401). In a particular example, and as illustrated in FIG. 4, the small group which will decompose 209 may be bonded to the bulky group which will not decompose 301. In such an embodiment, the monomer in which the bulky group which will not decompose 301 is bonded to the small group which will decompose 209 may have one of the following structures:

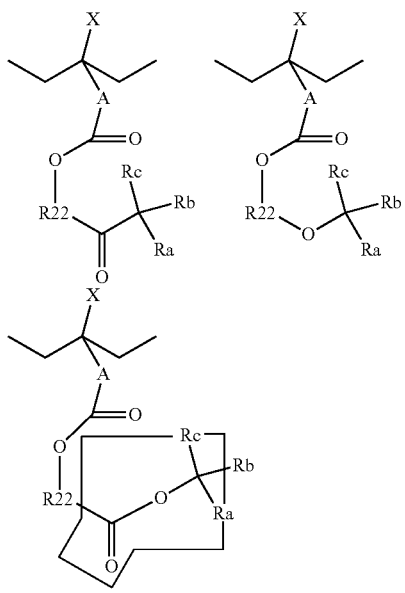

Wherein A represents a group selected from the group consisting of a C0-C8 alkanediyl group, a C1-C8 heteroalkanediyl group, a C2-C9 heteroalkenediyl group, a C3-C9 cycloalkenediyl group, a C2-C20 heterocycloalkanediyl group, or a C3-C9 heterocycloalkeneduyl group and R22 is a bulky unit with C2-C30 alkyl group, cycloalkyl group, hydroxylalkyl group, alkoxy group, alkoxyl alkyl group, acetyl group, acetylalkyl group, carboxyl group, alky caboxyl group, cycloalkyl carboxyl group, C2-C30 saturated or unsaturated hydrocarbon ring, or C2-C30 heterocyclic group which can be chain, ring, 3-D structure (adamantyl for example), cyclic to polymer backbone structure; X is hydrogen, a methyl group, or R22. Ra, Rb, and Rc are as described above with respect to the small group which will decompose 209 (described in FIG. 2).

In an embodiment in which the monomer in which the bulky group which will not decompose 301 is bonded to the small group which will decompose 209 has a cyclic structure bonded to the polymer backbone, the monomer in which the bulky group which will not decompose 301 is bonded to the small group which will decompose 209 may have the following structures:

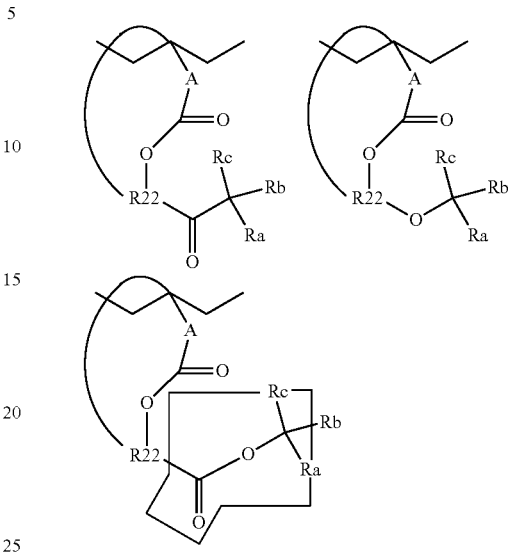

Wherein A, R22, Ra, Rb, and Rc are as described above.

In a particular embodiment, the monomer which comprises the small group which will not decompose 209 bonded to the bulky group which will not decompose 301 may have the following structure:

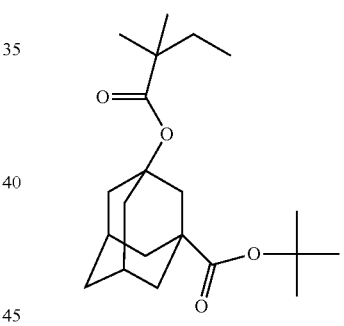

In an embodiment the overall loading of the combined bulky group which will not decompose 301 and the small group which will decompose 209 may be greater than about 5% of the overall loading on the hydrocarbon backbone. However, this loading is only intended to be illustrative and is not intended to be limiting upon the present embodiments. Rather, any suitable loading that will assist in the reduction of shrinkage and critical dimension loss may alternatively be utilized, and all such loadings are fully intended to be included within the scope of the embodiments.

By attaching the small group which will decompose 209 to the bulky group which will not decompose 301, the mass loss from the small group which will decompose 209 and the bulky group which will decompose 203 may be compensated. This compensation will reduce or mitigate the overall mass loss during degassing during and after exposure and post-exposure baking. Such a reduction will allow for a reduction in shrinkage and critical dimension losses, thereby allowing smaller imaging dimensions to be realized.

In an alternative embodiment, instead of attaching the small group which will decompose 209 to the bulky group which will not decompose 301, another cleavage unit, such as the bulky group which will decompose 203, may be attached to the bulk group which will not decompose 301. Any suitable unit that will cleavage may alternatively be utilized and bonded to the bulky group which will not decompose 301, and all such units are fully intended to be included within the scope of the embodiments.

FIG. 5 illustrates yet another embodiment similar to the embodiment in FIG. 4, but in which the small group which will decompose 209 is replaced on the bulky group which will not decompose 301 by a polar functional group (represented in FIG. 5 by the designation $R_2$ labeled 501). In an embodiment a monomer which comprises the polar functional group 501 bonded to the bulky group which will not decompose 301 may have a structure such as:

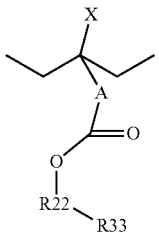

Wherein A represents a group selected from the group consisting of a C0-C8 alkanediyl group, a C1-C8 heteroalkanediyl group, a C2-C9 heteroalkenediyl group, a C3-C9 cycloalkenediyl group, a C2-C20 heterocycloalkanediyl group, or a C3-C9 heterocycloalkeneduyl group and R22 is a bulky unit with C2-C30 alkyl group, cycloalkyl group, hydroxylalkyl group, alkoxy group, alkoxyl alkyl group, acetyl group, acetylalkyl group, carboxyl group, alky caboxyl group, cycloalkyl carboxyl group, C2-C30 saturated or unsaturated hydrocarbon ring, or C2-C30 heterocyclic group which can be chain, ring, 3-D structure (adamantyl for example), cyclic to polymer backbone structure; and wherein R33 represents one of the following:

$R_4$—OH $R_5COOR_6$ $R_7(OH)_2$

Wherein $R_4$, $R_5$, $R_6$, and $R_7$ may each have be an alkyl chain, an alkyl cyclic structure, or an alkyl three-dimensional structure with between 2 carbon atoms and 20 carbon atoms. In a particular embodiment the polar functional group may be adamantyl, although any other suitable polar functional group may alternatively be utilized.

Alternatively, the polar functional group 501 may comprise the lactone group 205, as discussed above with respect to FIG. 2. Any suitable polar group may be utilized for this embodiment, and all such groups are fully intended to be included within the scope of the embodiments.

In an embodiment in which the monomer in which the bulky group which will not decompose 301 is bonded to the polar functional group 501 has a cyclic structure bonded to the polymer backbone, the monomer in which the bulky group which will not decompose 301 is bonded to the polar functional group 501 may have the following structure:

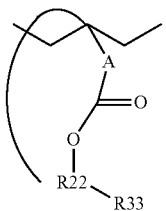

Wherein A, R22 and R33 are as described above.

In an embodiment the loading for the combination of the bulky group which will not decompose 301 and the polar functional group 501 may be greater than about 5% of the overall loading on the hydrocarbon backbone. However, this loading is only intended to be illustrative and is not intended to be limiting upon the present embodiments. Rather, any suitable loading that will assist in the reduction of shrinkage and critical dimension loss may alternatively be utilized, and all such loadings are fully intended to be included within the scope of the embodiments.

By adding the polar functional group 501 to the bulky group which will not decompose 301, the polar functional group 501 will reduce or retard the diffusion of the acids/bases/free radicals generated during the exposure process. Such a reduction of the diffusion will work to reduce undesired reactions outside of the exposed region 601, thereby further preventing any undesired reactions and the subsequent degassing. By reducing the degassing, shrinkage and critical dimension loss may be reduced and smaller items may be imaged.

Returning now to FIG. 1, additionally, the photoresist 111 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitrosubstituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl),5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 111 may be placed into a solvent in order to aid in the mixing and placement of the photoresist 111. To aid in the mixing and placement of the photoresist 111, the solvent is chosen at least in part based upon the materials chosen for the polymer resin as well as the PACs. In particular, the solvent is chosen such that the polymer resin and the PACs can be evenly dissolved into the solvent and dispensed upon the layer to be patterned 109.

In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist 111 include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the photoresist 111 are merely illustrative and are not intended to limit the embodiments. Rather, any suitable material that may dissolve the polymer resin and the PACs may alternatively be utilized to help mix and apply the photoresist 111. All such materials are fully intended to be included within the scope of the embodiments.

Additionally, while individual ones of the above described materials may be used as the solvent for the photoresist 111, in alternative embodiments more than one of the above described materials may be utilized. For example, the solvent may comprise a combination mixture of two or more of the materials described. All such combinations are fully intended to be included within the scope of the embodiments.

Optionally, a cross-linking agent may also be added to the photoresist 111. The cross-linking agent reacts with the polymer resin within the photoresist 111 after exposure, assisting in increasing the cross-linking density of the photoresist 111, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bis-methoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

In addition to the polymer resins, the PACs, the solvents, and the cross-linking agents, the photoresist 111 may also include a number of other additives that will assist the photoresist 111 obtain the highest resolution. For example, the photoresist 111 may also include surfactants in order to help improve the ability of the photoresist 111 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 111 is a quencher, which may be utilized to inhibit diffusion of the generated acids/bases/free radicals within the photoresist 111, which helps the resist pattern configuration as well as to improve the stability of the photoresist 111 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 111 is a stabilizer, which assists in preventing undesired diffusion of the acids generated during exposure of the photoresist 111. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 111 may be a dissolution inhibitor in order to help control dissolution of the photoresist 111 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 111 may be a plasticizer. Plasticizers may be used to reduce delamination and cracking between the photoresist 111 and underlying layers (e.g., the layer to be patterned 109) and may comprise monomeric, loigomeric, and polymeric plasticizers such as oligo-anpolyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 111 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 111 in order to promote adhesion between the photoresist 111 and an underlying layer upon which the photoresist 111 has been applied (e.g., the layer to be patterned 109). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 111 in order to assist a top surface of the photoresist 111 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the polymer resin and the PACs, along with any desired additives or other agents, are added to the solvent for application. Once added, the mixture is then mixed in order to achieve an even composition throughout the photoresist 111 in order to ensure that there are no defects caused by an uneven mixing or non-constant composition of the photoresist 111. Once mixed together, the photoresist 111 may either be stored prior to its usage or else used immediately.

Once ready, the photoresist 111 may be utilized by initially applying the photoresist 111 onto the layer to be patterned 109. The photoresist 111 may be applied to the layer to be patterned 109 so that the photoresist 111 coats an upper exposed surface of the layer to be patterned 109, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the layer to be patterned 109 of between about 10 nm and about 300 nm, such as about 150 nm.

Once the photoresist 111 has been applied to the layer to be patterned 109, a pre-bake of the photoresist 111 is performed in order to cure and dry the photoresist 111 prior to exposure to finish the application of the photoresist 111. The curing and drying of the photoresist 111 removes the solvent component while leaving behind the polymer resin, the PACs, cross-linking agents, and the other chosen additives. In an embodiment the pre-bake may be performed at a temperature suitable to evaporate the solvent, such as between about 40° C. and 150° C., although the precise temperature depends upon the materials chosen for the photoresist 111. The pre-bake is performed for a time sufficient to cure and dry the photoresist 111, such as between about 10 seconds to about 5 minutes, such as about 90 seconds.

Figure 6:
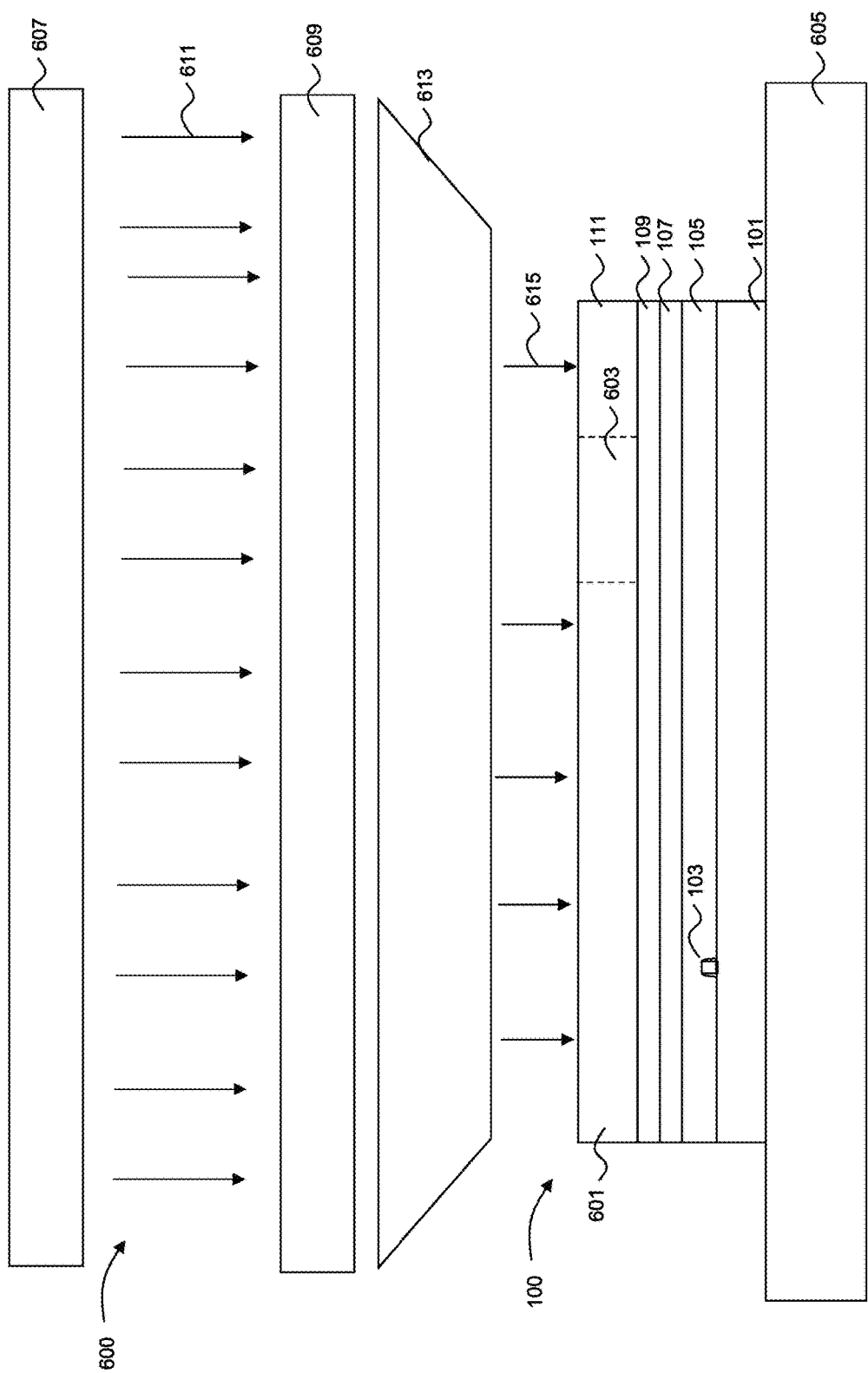
FIG. 6 illustrates an exposure of the photoresist in accordance with some embodiments.

FIG. 6 illustrates an exposure of the photoresist 111 to form an exposed region 601 and an unexposed region 603 within the photoresist 111. In an embodiment the exposure may be initiated by placing the semiconductor device 100 and the photoresist 111, once cured and dried, into an imaging device 600 for exposure. The imaging device 600 may comprise a support plate 605, an energy source 607, a patterned mask 609 between the support plate 605 and the energy source 607, and optics 613. In an embodiment the support plate 605 is a surface to which the semiconductor device 100 and the photoresist 111 may be placed or attached to and which provides support and control to the substrate 101 during exposure of the photoresist 111. Additionally, the support plate 605 may be movable along one or more axes, as well as providing any desired heating or cooling to the substrate 101 and photoresist 111 in order to prevent temperature gradients from affecting the exposure process.

In an embodiment the energy source 607 supplies energy 611 such as light to the photoresist 111 in order to induce a reaction of the PACs, which in turn reacts with the polymer resin to chemically alter those portions of the photoresist 111 to which the energy 611 impinges. In an embodiment the energy 611 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 607 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 611, such as mercury vapor lamps, xenon lamps, carbon arc lamps or the like, may alternatively be utilized.

The patterned mask 609 is located between the energy source 607 and the photoresist 111 in order to block portions of the energy 611 to form a patterned energy 615 prior to the energy 611 actually impinging upon the photoresist 111. In an embodiment the patterned mask 609 may comprise a series of layers (e.g., substrate, absorbance layers, anti-reflective coating layers, shielding layers, etc.) to reflect, absorb, or otherwise block portions of the energy 611 from reaching those portions of the photoresist 111 which are not desired to be illuminated. The desired pattern may be formed in the patterned mask 609 by forming openings through the patterned mask 609 in the desired shape of illumination.

Optics (represented in FIG. 6 by the trapezoid labeled 613) may be used to concentrate, expand, reflect, or otherwise control the energy 611 as it leaves the energy source 607, is patterned by the patterned mask 609, and is directed towards the photoresist 111. In an embodiment the optics 613 comprise one or more lenses, mirrors, filters, combinations of these, or the like to control the energy 611 along its path. Additionally, while the optics 613 are illustrated in FIG. 6 as being between the patterned mask 609 and the photoresist 111, elements of the optics 613 (e.g., individual lenses, mirrors, etc.) may also be located at any location between the energy source 607 (where the energy 611 is generated) and the photoresist 111.

In an embodiment the semiconductor device 100 with the photoresist 111 is placed on the support plate 605. Once the pattern has been aligned to the semiconductor device 100, the energy source 607 generates the desired energy 611 (e.g., light) which passes through the patterned mask 609 and the optics 613 on its way to the photoresist 111. The patterned energy 615 impinging upon portions of the photoresist 111 induces a reaction of the PACs within the photoresist 111. The chemical reaction products of the PACs' absorption of the patterned energy 615 (e.g., acids/bases/free radicals) then reacts with the polymer resin, chemically altering the photoresist 111 in those portions that were illuminated through the patterned mask 609.

In a specific example in which the patterned energy 615 is a 193 nm wavelength of light, the PAC is a photoacid generator, and the bulky group to be decomposed 203 is an acid leaving group on the hydrocarbon structure and a cross linking agent is used, the patterned energy 615 will impinge upon the photoacid generator and the photoacid generator will absorb the impinging patterned energy 615. This absorption initiates the photoacid generator to generate a proton (e.g., a H+ atom) within the photoresist 111. When the proton impacts the bulky group to be decomposed 203 on the hydrocarbon structure, the proton will react with the bulky group to be decomposed 203, cleaving the bulky group to be decomposed 203 from the hydrocarbon structure, and altering the properties of the polymer resin in general. The bulky group to be decomposed 203 can then degas from the photoresist 111 either immediately during the exposure process or during the post-exposure baking process (described below), thereby causing a mass loss of the photoresist 111, which shrinks in size and caused a deterioration of the critical dimensions of the pattern.

However, by additionally using the small group which will decompose 209 along with the bulky group which will decompose 203, such a mass loss can be reduced. In particular, during the exposure in the embodiment described above, in addition to the protons from the PACs impacting upon the bulky group which will decompose 203, the protons will also impact upon the small group which will decompose, causing it to also cleave from the hydrocarbon structure and degas during either the exposure process or the post-exposure baking process. However, because the small group which will decompose 209 has fewer atoms than the bulky group which will decompose 203, the overall mass loss from a single small group which will decompose is much less than from a single bulky group which will decompose 209. As such, by utilizing the small group which will decompose 209 in addition to the bulky group which will decompose 203, the overall mass loss and critical dimension deterioration can be reduced.

Alternatively, in the embodiment described above with respect to FIG. 3 in which a bulky group which will not decompose 301 is utilized in place of the small group which will decompose 209, the patterned energy 615 from the exposure will impinge upon the PACs and generate the protons, which will then react with the bulky group which decompose 203, causing it to cleave and leave the photoresist 111 with the bulky group which will not decompose 301 remaining on the hydrocarbon backbone. However, with the addition of the bulky group which will not decompose 301, the overall percentage of mass loss from the bulky group which will decompose 203 will be reduced, as the overall mass of the polymer resin is increased due to the presence of the bulky group which will decompose 301.

In the embodiment described above with respect to FIG. 4, in which the small group which will decompose 209 is attached to the bulky group which will not decompose 301, the patterned energy 615 will impinge upon the PACs to generate the protons, which will then react with the bulky group which will decompose 203 as well as the small group which will decompose 209, causing these groups to cleave from the hydrocarbon structure and eventually degas from the photoresist 111. However, by using the small group which will decompose 209 to reduce the amount of material that leaves as well as by using the bulky group which will not decompose 301 to increase the amount of material that will remain, the overall mass loss and its accompanying shrinkage and deterioration of the critical dimension will be reduced.

Finally, in the embodiment described above with respect to FIG. 4, in which a polar functional group is part of the polymer resin, the patterned energy 615 will impinge upon the PACs to generate the protons, which will then impact upon the bulky group which will decompose 203. However, the presence of the polar functional group will retard and decrease any diffusion of the protons (or bases or free radicals) away from the exposed region 601 of the photoresist 111. Such a reduction in diffusion will prevent the protons from reacting any further and causing undesired outgassing of by-products from the unexposed portion 603 of the photoresist 111. Such a prevention can help reduce the mass loss and shrinkage of the photoresist 111.

Returning to FIG. 6, the exposure of the photoresist 111 may optionally occur using an immersion lithography technique. In such a technique an immersion medium (not individually illustrated in FIG. 6) may be placed between the imaging device 600 (and particularly between a final lens of the optics 613) and the photoresist 111. With this immersion medium in place, the photoresist 111 may be patterned with the patterned energy 615 passing through the immersion medium.

In this embodiment a protective layer (also not individually illustrated in FIG. 6) may be formed over the photoresist 111 in order to prevent the immersion medium from coming into direct contact with the photoresist 111 and leaching or otherwise adversely affecting the photoresist 111. In an embodiment the protective layer is insoluble within the immersion medium such that the immersion medium will not dissolve it and is immiscible in the photoresist 111 such that the protective layer will not adversely affect the photoresist 111. Additionally, the protective layer is transparent so that the patterned energy 615 may pass through the protective layer.

In an embodiment the protective layer comprises a protective layer resin within a protective layer solvent. The material used for the protective layer solvent is, at least in part, dependent upon the components chosen for the photoresist 111, as the protective layer solvent should not dissolve the materials of the photoresist 111 so as to avoid degradation of the photoresist 111 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be a alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan mono stearate, polyoxyethylene sorbitan trioleate and polyoxyethylene sorbitan tristearate.

Prior to application of the protective layer onto the photoresist 111, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 111. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the photoresist 111 of about 100 nm.

After the protective layer composition has been applied to the photoresist 111, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 111, the semiconductor device 100 with the photoresist 111 and the protective layer are placed on the support plate 605, and the immersion medium may be placed between the protective layer and the optics 613. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 613 may be done using, e.g., an air knife method, whereby fresh immersion medium is applied to a region between the protective layer and the optics 613 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 111 may be exposed using an immersion method. Any other suitable method for imaging the photoresist 111 using an immersion medium, such as immersing the entire substrate 101 along with the photoresist 111 and the protective layer, using solid barriers instead of gaseous barriers, or using an immersion medium without a protective layer, may also be utilized. Any suitable method for exposing the photoresist 111 through the immersion medium may be used, and all such methods are fully intended to be included within the scope of the embodiments.

After the photoresist 111 has been exposed to the patterned energy 615, a post-exposure baking may be used in order to assist in the generating, dispersing, and reacting of the acid/base/free radical generated from the impingement of the patterned energy 615 upon the PACs during the exposure. Such assistance helps to create or enhance chemical reactions which generate chemical differences between the exposed region 601 and the unexposed region 603 within the photoresist 111. These chemical differences also cause differences in the solubility between the exposed region 601 and the unexposed region 603. In an embodiment this post-exposure baking may occur at temperatures of between about 50° C. and about 160° C. for a period of between about 40 seconds and about 120 seconds.

Figure 7:
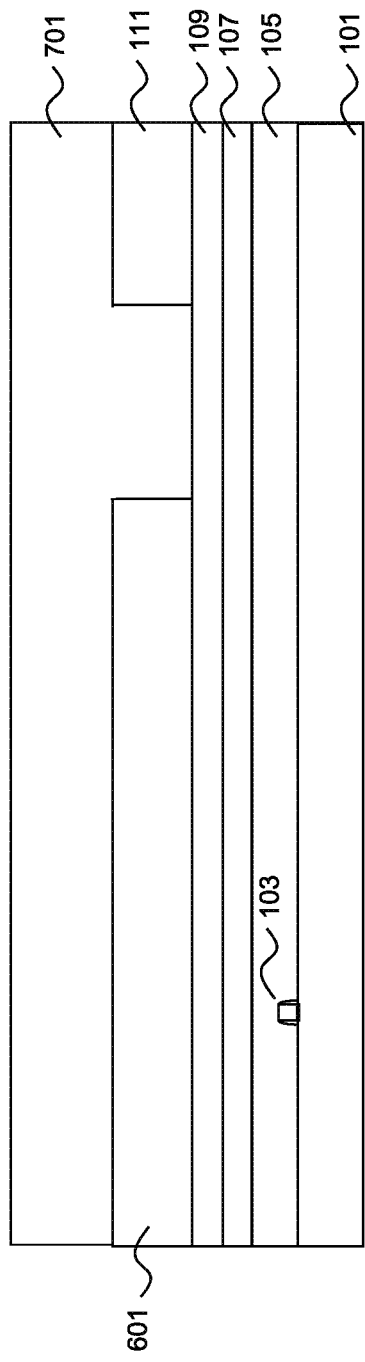
FIG. 7 illustrates a development of the photoresist in accordance with some embodiments.

FIG. 7 illustrates a development of the photoresist 111 with the use of a developer 701 after the photoresist 111 has been exposed. After the photoresist 111 has been exposed and the post-exposure baking has occurred, the photoresist 111 may be developed using either a negative tone developer or a positive tone developer, depending upon the desired pattern for the photoresist 111. In an embodiment in which the unexposed region 603 of the photoresist 111 is desired to be removed to form a negative tone, a negative tone developer such as an organic solvent or critical fluid may be utilized to remove those portions of the photoresist 111 which were not exposed to the patterned energy 615 and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

If a positive tone development is desired, a positive tone developer such as a basic aqueous solution may be utilized to remove those portions of the photoresist 111 which were exposed to the patterned energy 615 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 111 that has a different property (e.g., solubility) than another portion of the photoresist 111, may alternatively be utilized, and all such developers are fully intended to be included within the scope of the embodiments.

In an embodiment in which immersion lithography is utilized to expose the photoresist 111 and a protective layer is utilized to protect the photoresist 111 from the immersion medium, the developer 701 may be chosen to remove not only those portions of the photoresist 111 that are desired to be removed, but may also be chosen to remove the protective layer in the same development step. Alternatively, the protective layer may be removed in a separate process, such as by a separate solvent from the developer 701 or even an etching process to remove the protective layer from the photoresist 111 prior to development.

FIG. 7 illustrates an application of the developer 701 to the photoresist 111 using, e.g., a spin-on process. In this process the developer 701 is applied to the photoresist 111 from above the photoresist 111 while the semiconductor device 100 (and the photoresist 111) is rotated. In an embodiment the developer 701 may be supplied at a flow rate of between about 10 ml/min and about 2000 ml/min, such as about 1000 ml/min, while the semiconductor device 100 is being rotated at a speed of between about 100 rpm and about 3500 rpm, such as about 1500 rpm. In an embodiment the developer 701 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 111 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 7 illustrates a cross-section of the development process in which a negative tone developer is utilized. As illustrated, the developer 701 is applied to the photoresist 111 and dissolves the unexposed portion 603 of the photoresist 111. This dissolving and removing of the unexposed portion 603 of the photoresist 111 leaves behind an opening within the photoresist 111 that patterns the photoresist 111 in the shape of the patterned energy 615, thereby transferring the pattern of the patterned mask 609 to the photoresist 111.

Figure 8:
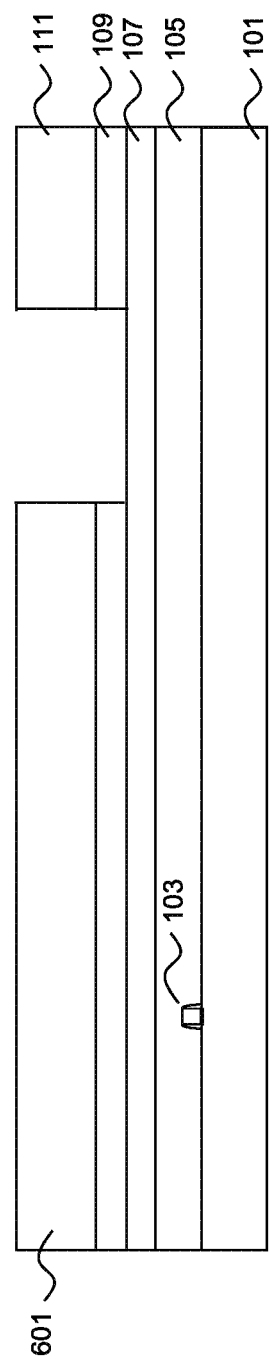
FIG. 8 illustrates a removal of a developer in accordance with some embodiments.

FIG. 8 illustrates a removal of the developer 701 and the photoresist 111 after it has been developed with the developer 701. In an embodiment the developer 701 may be removed using, e.g., a spin-dry process, although any suitable removal technique may alternatively be utilized. After the photoresist 111 has been developed additional processing may be performed on the layer to be patterned 109 while the photoresist 111 is in place. As one example, a reactive ion etch or other etching process may be utilized to transfer the pattern of the photoresist 111 to the underlying layer to be patterned 109. Alternatively, in an embodiment in which the layer to be patterned 109 is a seed layer, the layer to be patterned 109 may be plated in order to form, e.g., a copper pillar, or other conductive structure in the opening of the photoresist 111. Any suitable processing, whether additive or subtractive, that may be performed while the photoresist 111 is in place may be performed, and all such additional processing are fully intended to be included within the scope of the embodiments.

Once the layer to be patterned 109 has been patterned using the photoresist 111, the photoresist may be removed from the layer to be patterned 109 (not separately illustrated in FIG. 8). In an embodiment an ashing process may be utilized in order to remove the photoresist 111, whereby the temperature of the photoresist 111 is increased to cause a thermal breakdown of the photoresist 111, which can then be removed using a cleaning procedure such as a rinse. Alternatively the photoresists 111 may be removed using, e.g., a wet etching process. Any suitable method for removing the photoresist 111 may be used, and all such methods are fully intended to be included within the scope of the embodiment.

By utilizing the additional structures on the hydrocarbon backbone as discussed in the above described embodiments, each embodiment can independently decrease shrinkage of the photoresist 111 below 20% after the post-exposure baking. Such a reduction in the shrinkage reduces the deterioration of the critical dimensions of the photoresist 111 and allows for smaller and smaller images to be formed within the photoresist 111.

In accordance with an embodiment, a photoresist comprising a hydrocarbon backbone and a first group which will decompose is provided. The first group which will decompose has a first number of carbon atoms. The photoresist also has a second group which will decompose, the second group which will decompose having a second number of carbon atoms smaller than the first number of carbon atoms and smaller than nine carbon atoms.

In accordance with another embodiment, a photoresist comprising a solvent, a photoactive compound, and a polymer resin is provided. The polymer resin further comprises a first group which will decompose that has no more than 9 carbon atoms, and a second group which will decompose that has greater than nine carbon atoms.

In accordance with yet another embodiment, a method of manufacturing a semiconductor device comprising applying a photoresist to a layer to be patterned is provided. The photoresist comprises a hydrocarbon backbone, a first group which will decompose, wherein the first group which will decompose comprises greater than 9 carbon atoms, and a second group which will decompose, wherein the second group which will decompose comprises no greater than 9 carbon atoms. The photoresist is exposed to a patterned light source, and the photoresist is developed after the exposing the photoresist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A photoresist comprising:
   a polymer resin comprising:
      a hydrocarbon backbone;
      a bulky leaving group bonded to the hydrocarbon backbone, the bulky leaving group having more than nine carbon atoms;
      a group which will not decompose bonded to the hydrocarbon backbone, the group which will not decompose having from nine to thirty carbon atoms; and a small leaving group bonded to the group which will not decompose, the small leaving group having less than nine carbon atoms, the small leaving group comprising a cycloalkyl group and one of a $C_4$-$C_5$ alkyl group, an acetyl group, or an acetyl alkyl group;

a photoactive compound; and a solvent.

2. The photoresist of claim 1, wherein the bulky leaving group has a loading on the hydrocarbon backbone of greater than 45%.

3. The photoresist of claim 1, wherein the polymer resin further comprises a lactone group comprising a five to seven member ring.

4. The photoresist of claim 3, wherein the lactone group has a loading on the hydrocarbon backbone of from 30% to 70%.

5. The photoresist of claim 1, wherein the group which will not decompose has a loading on the hydrocarbon backbone of greater than 5%.

6. The photoresist of claim 1, wherein the group which will not decompose and the small leaving group have a combined loading on the hydrocarbon backbone of greater than 5%.

7. The photoresist of claim 1, wherein the polymer resin further comprises an adhesive group comprising a hydroxyl group or a cyano group.

8. The photoresist of claim 7, wherein the adhesive group has a loading on the hydrocarbon backbone of less than 20%.

9. A photoresist comprising:
a singular polymer, the singular polymer comprising:
a hydrocarbon backbone;
a first acid labile group having less than 9 carbon atoms, the first acid labile group comprising a cycloalkyl group and further comprising a $C_4$-$C_5$ alkyl group, an acetyl group, or an acetyl alkyl group; and
a second acid labile group, wherein the second acid labile group comprises greater than 9 carbon atoms.

10. The photoresist of claim 9, wherein the first acid labile group is bonded directly to the hydrocarbon backbone.

11. The photoresist of claim 9, wherein the first acid labile group is bonded to a group which will not decompose, and wherein the group which will not decompose is bonded to the hydrocarbon backbone.

12. The photoresist of claim 11, wherein the group which will not decompose has from nine to thirty carbon atoms.

13. The photoresist of claim 12, wherein repeating units comprising the group which will not decompose are present in an amount of greater than 5% of all of the repeating units present in the singular polymer.

14. The photoresist of claim 9, wherein repeating units comprising the second acid labile group are present in an amount of greater than 30% of all of the repeating units present within the singular polymer.

15. A photoresist comprising:
a polymer resin, the polymer resin comprising a bulky leaving group bonded to a hydrocarbon backbone and a cleavage unit bonded to the hydrocarbon backbone, wherein:
the bulky leaving group has a loading of greater than 45% and comprises more than nine carbon atoms; and
the cleavage unit has a loading of greater than 5%, has less than 9 carbon atoms, and comprises a cycloalkyl group and a $C_4$-$C_5$ alkyl group.

16. The photoresist of claim 15, further comprising one or more photoactive compounds (PACs).

17. The photoresist of claim 15, wherein the polymer resin further comprises a group which will not decompose, the group which will not decompose comprising an alkyl chain, an alkyl ring, or a three-dimensional alkyl structure having between 9 and 30 carbon atoms.

18. The photoresist of claim 17, wherein the cleavage unit is bonded to the hydrocarbon backbone through the group which will not decompose.

19. The photoresist of claim 15, wherein the polymer resin further comprises a lactone group bonded to the hydrocarbon backbone, wherein the lactone group has a loading from 30% to 70%, and wherein the lactone group comprises a five to seven member ring.

20. The photoresist of claim 15, wherein the polymer resin further comprises an adhesive group bonded to the hydrocarbon backbone, wherein the adhesive group has a loading of greater than 20%, and wherein the adhesive group comprises at least one of a hydroxyl group or a cyano group.

* * * * *